US008538570B2

(12) United States Patent
Stanhope et al.

(10) Patent No.: US 8,538,570 B2
(45) Date of Patent: Sep. 17, 2013

(54) PROCESS AND SYSTEM FOR MANUFACTURING A CUSTOMIZED ORTHOSIS

(75) Inventors: Steven J. Stanhope, Gaithersburg, MD (US); Elisa Schrank, Newark, DE (US)

(73) Assignee: University of Delaware, Newark, DE (US)

( * ) Notice: Subject to any disclaimer, the term of this patent is extended or adjusted under 35 U.S.C. 154(b) by 348 days.

(21) Appl. No.: 12/879,805

(22) Filed: Sep. 10, 2010

(65) Prior Publication Data

US 2011/0082578 A1  Apr. 7, 2011

Related U.S. Application Data

(60) Provisional application No. 61/241,608, filed on Sep. 11, 2009.

(51) Int. Cl.
    *G06F 19/00* (2011.01)
(52) U.S. Cl.
    USPC ............................. 700/98; 382/154; 602/14
(58) Field of Classification Search
    USPC ............................. 700/98; 382/154; 602/14
    See application file for complete search history.

(56) References Cited

U.S. PATENT DOCUMENTS

| 5,432,703 | A | 7/1995 | Clynch |
| 6,141,889 | A | 11/2000 | Baum |
| 6,463,351 | B1 | 10/2002 | Clynch |
| 2007/0118243 | A1* | 5/2007 | Schroeder et al. ............ 700/118 |
| 2008/0292179 | A1* | 11/2008 | Busch .......................... 382/154 |
| 2009/0306801 | A1* | 12/2009 | Sivak et al. ..................... 700/98 |
| 2010/0094174 | A1* | 4/2010 | Choi et al. .................... 600/587 |
| 2010/0113980 | A1* | 5/2010 | Herr et al. ..................... 600/587 |
| 2010/0262054 | A1* | 10/2010 | Summit et al. .................. 602/14 |

OTHER PUBLICATIONS

International Search Report dated May 31, 2011, application No. PCT/US2010/048430.
U.S. Appl. No. 61/112,751, filed Nov. 9, 2008, Scott Summit.
U.S. Appl. No. 61/168,183, filed Apr. 9, 2009, Scott Summit.
U.S. Appl. No. 61/185,781, filed Jun. 10, 2009, Scott Summit.
Berry et al., "Preliminary experience with medical applications of rapid prototyping by selective laser sintering," *Med. Eng. Phys.*, 19(1):90-96, 1997.
Darling et al., "Orthotic design through 3D reconstruction: A passive-assistance ankle-foot orthotic,"*ABBi*, 3(2):93-99, 2006.
Dean et al., "Computer Aided Design of Large-Format Prefabricate Cranial Plates," *Journal of Craniofacial Surgery*, 14(6):819-832, 2003.

(Continued)

*Primary Examiner* — Mohammad Ali
*Assistant Examiner* — Anthony Whittington
(74) *Attorney, Agent, or Firm* — RatnerPrestia

(57) ABSTRACT

A process and system for fitting, customizing and manufacturing an orthosis for a subject. 3-dimensional coordinates for a plurality of landmarks corresponding to anatomical characteristics of the subject, means for attachment of the orthosis to the subject, and a reference plane are digitally acquired. Then, coordinates of one or more virtual landmarks corresponding to one or more anatomical joint centers or joint projection locations are calculated. The landmarks are clinically aligned in a reference position of one of the anatomical joint centers and a customized digital model of the orthosis is created using the clinically aligned landmarks. Finally, the orthosis is fabricated using a computer aided manufacturing process, based upon an output from the customized digital model.

33 Claims, 7 Drawing Sheets

(56) References Cited

OTHER PUBLICATIONS

Faustini et al., "An Experimental and Theoretical Framework for Manufacturing Prosthetic Sockets for Transtibial Amputees," *IEEE Transactions on Neural Systems and Rehabilitation Engineering*, 14(3):304-310, Sep. 2006.

Faustini et al., "Manufacture of Passive Dynamic Ankle-Foot Orthoses Using Selective Laser Sintering," *IEEE Transactions on BioMedical Engineering*, 55(2):784-790, Feb. 2008.

Ibrahim et al., "Dimensional error of selective laser sintering, three-dimensional printing and PolyJet™ models in the reproduction of mandibular anatomy," *Journal of Cranio-Maxillofacial Surgery*, vol. 37, pp. 167-173, 2009.

Kepple et al., "Measuring the Sources of Deformation of a Dynamic Ankle Foot Orthosis During Gait," *Disabilities Branch, National Institutes of Health, Department of Health and Human Services*, 2 pages.

Kepple et al., "Relative contributions of the lower extremity joint moments to forward progression and support during gait," *Gait & PostureI*, vol. 6, pp. 1-8, 1997.

McLucas et al., "PD-AFO Customization Via Parameterization," *Physical Disabilities Branch, National Institutes of Health*, 1 page, Jul. 29-Aug. 3, 2007.

Nascimento et al., "Dimensional error in selective laser sintering and 3D-printing of models for craniomaxillary anatomy reconstruction," *Journal of Cranio-Maxillofacial Surgery*, vol. 36, pp. 443-449, 2008.

Nelson et al., "Ankle Foot Orthosis Contribution to Net Ankle Moments in Gait," *Physical Disabilities Branch, National Institutes of Health, Department of Health and Human Services*, 2 pages.

Rogers et al., "Computerized manufacturing of transparent face masks for the treatment of facial scarring," *The Journal of Burn Care & Rehabilitation*, 24(2):91-96, 2003.

Rogers et al., "Advanced trans-tibial socket fabrication using selective laser sintering," *Prosthetics and Orthotics International*, 31(1):88-100, Mar. 2007.

Senthilkumaran et al., "Influence of building strategies on the accuracy of parts in selective laser sintering," *Materials and Design*, vol. 30, pp. 2946-2954, 2009.

Siegel et al., "Joint moment control of mechanical energy flow during normal gait," *Gait and Posture*, vol. 19, pp. 69-75, 2004.

Smith et al., "The use of CAD/CAM technology in prosthetics and orthotics—Current clinical models and a view to the future," *Journal of Rehabilitation Research and Development*, 38(3):327-334, May/Jun. 2001.

Statts et al., "Computer Aided Design and Computer Aided Manufacturing of Foot Orthoses," *Journal of Prosthetics and Orthotics*, 1(3):182-186, 1989.

Uzun, G., "An Overview of Dental CAD/CAM Systems," *Biotechnol. & Biotechnol. Eq.*, pp. 530-535, Jan. 1, 2008.

\* cited by examiner

PROCESS AND SYSTEM FOR MANUFACTURING A CUSTOMIZED ORTHOSIS

CROSS REFERENCE TO RELATED APPLICATIONS

This application claims priority to U.S. Provisional Application Ser. No. 61/241,608, filed Sep. 11, 2009, which is incorporated herein, in its entirety, by reference.

BACKGROUND OF THE INVENTION

According to the 2005 Americans with Disabilities report, approximately 27 million people over the age of 15 had a walking-related disability. Ankle joint musculature plays an extremely important role during walking and is thought to be the primary muscle group that supports upright stance and produces forward propulsion. Individuals with muscular weakness about the ankle, an impairment often caused by upper motor neuron disorders and lower extremity injuries, are frequently prescribed ankle-foot orthoses (AFOs), which brace the ankle during gait and aim to improve gait function.

Passive-dynamic ankle-foot orthoses (PD-AFOs) constitute one class of ankle braces that rely on material properties and physical features to establish functional characteristics such as bending or rotational stiffness and the storage and return of mechanical energy. PD-AFOs are traditionally composed of footplate, strut and cuff components, which may be fabricated using continuous material or connected as components in various manners. Despite the great potential for biomechanical assessment and treatment using this classification of orthoses, currently prescribed PD-AFOs are often generic, having standardized size and shape (fit) and bending or rotational stiffness (functional) characteristics.

Fit customization is an important design factor for obtaining optimal function from a PD-AFO. The size and shape characteristics, which describe the fit of a PD-AFO, can be customized through a variety of methods. Traditionally, an orthotist casts a patient's shank and foot to create a negative mold. A positive mold is generated from the negative mold, and then the PD-AFO is manually fabricated around this positive mold similar to methods for fabricating a foot orthosis. While manual manufacturing methods can sufficiently generate a PD-AFO with customized size, augmented shape, and functional characteristics, manual manufacturing methods can contribute to undesirable variability in quality or effectiveness of manufactured components, depending on an orthotists' skill and experience, and may require substantial time and expertise to ultimately manufacture orthoses having functional characteristics that match the unique gait dynamics of each patient. Additionally, while this method can sufficiently generate a PD-AFO with customized size characteristics, shape characteristics such as component curvatures and joint alignment cannot be precisely tuned. Furthermore, the position of the ankle joint is fixed at the time of casting and thus clinical joint alignments cannot be made during the fabrication process. The cost of such customized devices is also substantial.

Recent efforts have worked on using computer aided design (CAD) models and associated parameterization tools to customize orthoses. At least one such parameterized orthosis model has been reported to have two rigid components, one for each of the foot and shank, attached by a single-degree-of-freedom hinge. Parameterization of this model was based on two anatomically-relevant coordinate systems, one for each of the components. Patient-specific imaging data were fit to the parameterized model to scale the orthosis. While this CAD model was parameterized for size and ankle angle, the orthosis design lacked the organic shape characteristics and parameterization of orthosis functional characteristics. Furthermore, the coordinate planes and resulting parameterization were dependent on the position of the shank and foot during collection of the imaging data.

Therefore, there is a need in the art for systems and processes that enable rapid design and manufacture of customized orthoses with precisely controlled characteristics. Such systems and processes have the potential to transform the PD-AFO customization and fabrication process from a craft-based industry into a modern clinical specialty.

SUMMARY OF THE INVENTION

The various aspects of the invention generally comprises processes and systems for the rapid manufacture of passive dynamic orthoses for a subject.

One claimed process comprises the steps of digitally capturing 3-dimensional coordinates for a plurality of landmarks corresponding to anatomical characteristics of the subject, means for attachment of the orthosis to the subject, and/or a reference plane. Then, the coordinates of one or more virtual landmarks corresponding to one or more anatomical joint centers or joint projection locations are calculated. Next, the landmarks are clinically aligned in a reference position of one of the anatomical joint centers, a customized digital model of the orthosis is created using the clinically aligned landmarks, and the orthosis is fabricated using a computer aided manufacturing process based upon an output from the customized digital model.

In one embodiment, the process may further comprise digitally capturing and calculating the virtual coordinates within a first coordinate system and converting the coordinates from the first coordinate system to a second, anatomically relevant coordinate system prior to the next step. The computer aided manufacturing process may comprise a selective laser sintering process.

The orthosis may, for example, comprise an ankle-foot orthosis. In such embodiments, the anatomical landmarks may correspond to the size and shape characteristics of the subject's shank and foot, the means for attachment of the orthosis comprises a cuff, and the virtual landmarks correspond to an ankle joint center, a knee joint center, and an ankle joint center projection location. The process may further include aligning the landmarks with the ankle joint center in a reference position, such as a neutral position.

The ankle-foot orthosis may comprise a footplate for disposition under the subject's foot, a strut connected to the footplate, and a cuff connected to the strut for affixation to the subject's shank. The digital model may further comprise inputs for customizing one or more parameters selected from the group consisting of: footplate thickness, footplate padding offset, cuff thickness, cuff padding offset, strut offset, toe rocker curvature, heel rocker curvatures, and toe spring angle.

Another exemplary embodiment of the claimed process comprises a process for fitting and manufacturing an ankle-foot orthosis for a subject. The steps of this process comprise identifying and marking a plurality of anatomical and cuff landmarks corresponding to the size and shape characteristics of the subject's shank and foot, digitally capturing three-dimensional coordinates within a first coordinate system for the plurality of anatomical and cuff landmarks and a plurality of ground landmarks corresponding to a horizontal ground plane coinciding with a plantar surface of the subject's foot, and calculating coordinate locations for virtual landmarks corresponding to an ankle joint center, a knee joint center, and an ankle joint center projection location. The coordinates of the digitally captured and virtual landmarks are then converted from the first coordinate system to an anatomically relevant coordinate system. Next, the process clinically aligns the landmarks within the second coordinate system with the ankle joint center in a neutral reference position. A customized digital model of the ankle-foot orthosis is then created using the clinically aligned landmarks for the subject, and the ankle-foot orthosis is fabricated directly from the customized digital model using a computer aided manufacturing process.

The computer aided manufacturing process may comprise a selective laser sintering process. The ankle-foot orthosis may comprise a footplate for disposition under the subject's foot, a strut connected to the footplate, and a cuff connected to the strut for affixation to the subject's shank. The digital model may further include inputs for customizing one or more parameters selected from the group consisting of: footplate thickness, footplate padding offset, cuff thickness, cuff padding offset, strut offset, toe rocker curvature, heel rocker curvatures, and toe spring angle. The ankle-foot orthosis may also further comprise a medial upper span and lateral upper span connecting the cuff to the strut and a medial lower span and lateral lower span connecting the strut to the footplate. The plurality of anatomical landmarks may comprise landmarks corresponding to anatomical features selected from the group consisting of: distal ends of toes; medial, superior, and lateral aspects of metatarsal heads and bases, medial aspect of navicular tubercle, medial and lateral aspects of medial and lateral malleolus, medial and lateral aspects of calcaneal surface, center of posterior calcaneal surface, superior-most point on fibula, anterior aspect of tibial tubercle, and medial and lateral femoral epicondyle.

Another aspect of the invention comprises a system for manufacturing an orthosis for a subject. The system comprises a coordinate measurement machine for digitally capturing three-dimensional locations within a first coordinate system for landmarks corresponding to anatomical characteristics of the subject, means for attaching the orthosis to the subject, and a reference plane. The coordinate measurement machine is configured to provide an output corresponding to the digitally captured coordinates of the landmarks. The system further comprises a processor or network of connected processors configured to receive the output of the coordinate measurement machine and programmed with one or more sets of instructions, including instructions to perform the steps of: calculating locations of one or more virtual landmarks corresponding to one or more anatomical joint centers or joint projection locations; converting the digitally captured coordinates from the first coordinate system to an anatomically relevant coordinate system; clinically aligning the landmarks within the second coordinate system with a selected anatomical joint center in a reference position; and creating a customized digital model of the orthosis using the clinically aligned landmarks. The system further comprises a computer aided manufacturing system connected to the processor or plurality of connected processors, configured to receive an output of the customized digital model, and programmed with a set of instructions to fabricate the orthosis based upon the output of the customized digital model.

In some exemplary embodiments of the claimed system the computer aided manufacturing system may comprise a system for selective laser sintering, the coordinate measurement machine may comprise a measuring arm, and/or the processor or network of connected processors may comprise a computer aided design system programmed with the steps for creating the customized digital model.

BRIEF DESCRIPTION OF THE DRAWINGS

The foregoing summary, as well as the following detailed description of exemplary embodiments of the invention, will be better understood when read in conjunction with the appended drawings, which are incorporated herein and constitute part of this specification. For the purposes of illustrating the invention, there are shown in the drawings exemplary embodiments of the present invention. It should be understood, however, that the invention is not limited to the precise arrangements and instrumentalities shown. In the drawings, the same reference numerals are employed for designating the same elements throughout the several figures. In the drawings.

DETAILED DESCRIPTION OF THE INVENTION

Figure 1:
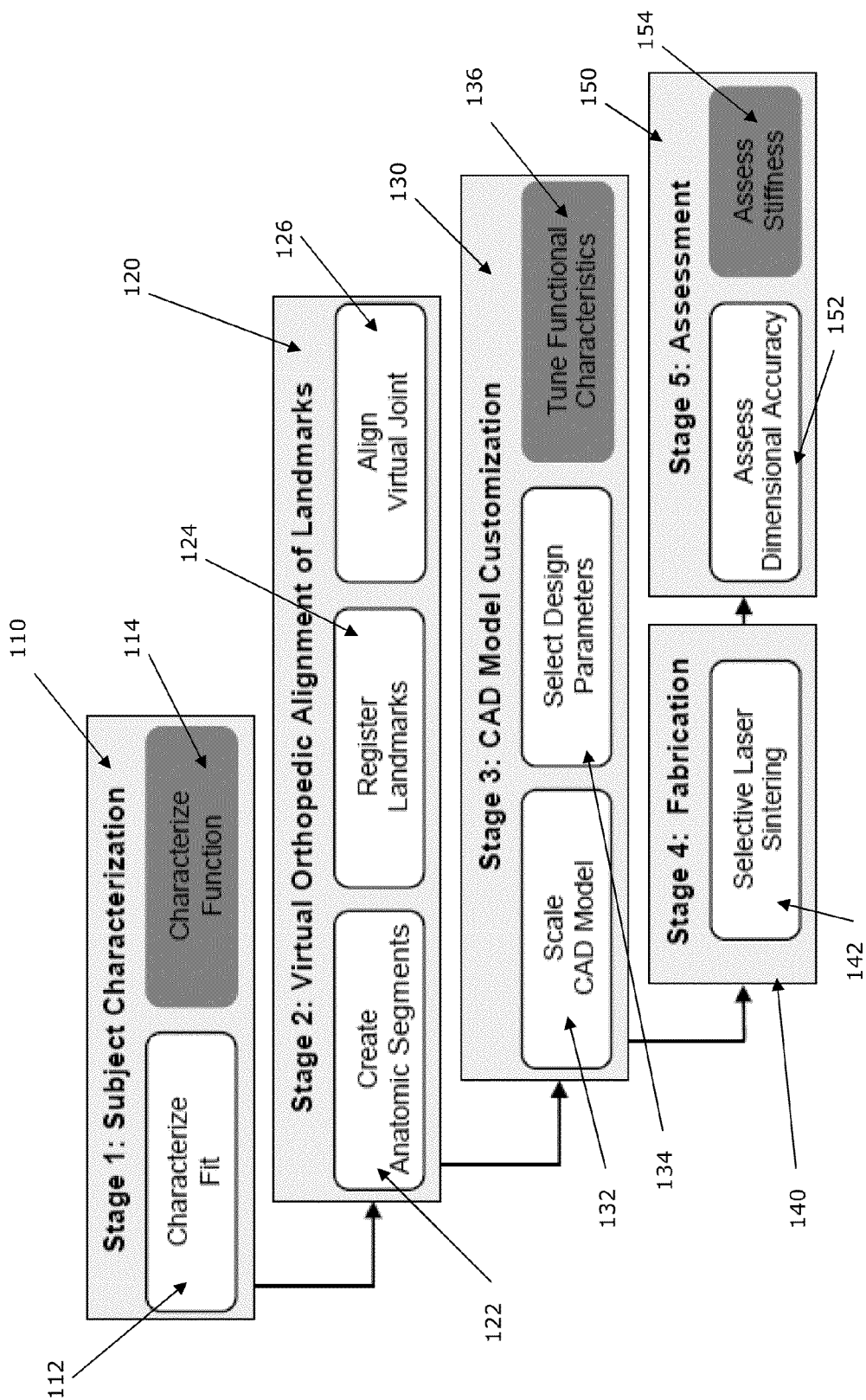
FIG. 1 is a schematic outlining an exemplary orthosis customization and manufacturing framework comprising five sequential stages.

Although the invention is illustrated and described herein with reference to specific embodiments, the invention is not intended to be limited to the details shown. Rather, various modifications may be made in the details within the scope and range of equivalents of the claims and without departing from the invention.

For the purpose of this application, parameterization is defined as the process of identifying the parameters necessary for the complete specification as well as manipulation of the PD-AFO CAD model. Using parameters to specify and manipulate a PD-AFO CAD model has profound implications for the objective and precise customization of biomechanically-designed orthoses that match patient needs with orthosis function. For example, the overall size of a CAD model can be readily and objectively increased by a discrete percent when the general scale parameter value is changed. PD-AFOs typically rely on material properties and physical features to establish functional characteristics such as bending or rotational stiffness. By forming inter-parameter hierarchal dependencies, single value parameters can control more complex PD-AFO characteristics (e.g., the radial expansion of a cuff's inner surface to accommodate padding thickness). Tuned functional characteristics of a PD-AFO such as rotational or bending stiffness may be readily achieved when a hierarchy of shape-related parameters is optimized to generate a CAD model having optimal component size, shape and thickness. While the full parameterization of a CAD model provides a powerful means for designing PD-AFOs with unique and highly personalized characteristics, manufacturing these PD-AFOs requires techniques beyond the traditional PD-AFO manufacturing practices.

Rapid freeform manufacturing techniques, such as selective laser sintering (SLS), allow for the rapid fabrication of unique parts. SLS is an additive process where a CO2 laser beam selectively heats and fuses (sinters) the powder material into a solid part. Layer-by-layer the powder is evenly rolled out over the machine bed, and the laser draws a cross section of the part into each subsequent powder layer. The surrounding, unsintered material provides the support structure for the part. An advantage of the SLS process is that cost of manufacturing is primarily a function of part volume and not part intricacy, thus this method is ideal for fabricating objects with unique, complex geometry. Recently, the use of SLS for fabrication of lower-limb prosthetic sockets, dynamic prosthetic feet and the mass customization of foot orthoses have been investigated. While recent studies have demonstrated the feasibility of using SLS manufacturing techniques for dynamic prosthetic and orthotic applications, previous reports indicate that dimensional accuracy of SLS-fabricated parts can vary due to several factors including part shrinkage and SLS build parameters. This drawback is a concern when manufacturing parts that require specific dimensions, such as the size and shape of the force-bearing surface of the cuff and foot outline of a PD-AFO. Building a scale part to determine the necessary scale factors for a particular material type and set of build parameters is a standard technique used to improve dimensional accuracy of SLS fabricated parts. However, the scale part does not account for part-specific factors such as build orientation and position and geometry-dependent shrinkage. Thus, the dimensional accuracy must be assessed on a part-by-part basis.

One embodiment of the invention comprises an automated customization and manufacturing framework that supports the automated fit and functional customization, rapid customized manufacturing and subsequent assessment of PD-AFOs. Although described herein with respect to PD-AFO manufacture, the processes described herein may be used for fabrication of any type of orthosis. A sub-method of the framework, which relates to fit customization, contains novel subject fit characterization and orthopedic alignment techniques. The framework harnesses the strengths of a fully parameterized PD-AFO CAD model and SLS manufacturing to rapidly customize and fabricate PD-AFOs. Creation of exemplary PD-AFOs using the techniques described herein permitted objective assessment of overall dimensional accuracy while subjectively assessing fit of PD-AFOs resulting from the fit customization and manufacturing framework. Although described in connection with an SLS manufacturing method, other rapid manufacturing techniques may be used.

Embodiments of the invention relate to a novel framework which combines a fully-parameterized computer-aided design (CAD) PD-AFO model and free-form fabrication to rapidly manufacture customized PD-AFOs. The three-dimensional locations of select anatomic landmarks may serve to fit customize the PD-AFO CAD model. A virtual orthopedic alignment process and selection of discrete design parameter values further customize the orthosis, which may be fabricated via selective laser sintering.

In one embodiment of the invention, the automated customization and manufacturing framework comprises five primary stages, as shown in FIG. 1. The overall framework of one exemplary method, containing both fit and function customization, is described below. In Stage One (block 110) of the method, the size and shape characteristics needed for the orthosis are digitally captured from the subject as discrete three-dimensional (3D) digitized landmarks. This step is referred to as the Subject Characterization stage. Stage One may consist of two intermediate steps, characterizing the fit of the subject 112 and characterizing the function of the subject 114. The digitized landmarks comprise segment-defining as well as shape-characterization landmarks.

Stage Two (block 120) comprises making a virtual orthopedic alignment of landmarks. Stage Two may be subdivided into three sub-steps. In the first of these steps 122, the segment landmarks are used to form joint centers for the knee and ankle and anatomically-relevant segment coordinate systems for the shank and foot. At step 124, the shape characterization landmarks are registered to the segment coordinate systems. At step 126, all landmarks undergo virtual orthopedic alignment by rotating the shank coordinate system and related landmarks relative to the foot segment about a shared virtual ankle joint center.

At Stage Three (block 130), the virtual orthopedic alignment of landmarks is converted into a CAD model customization. Stage Three may be subdivided into three sub-steps. In step 132, the virtual orthopedic alignment process produces landmark location data that serves as the custom fit parameters for the fully-parameterized CAD model. At step 134, select design parameters may be employed to further customize the CAD model. Finally, at step 136 the functional characteristics may be tuned to further customize the CAD model.

At Stage Four (block 140), the customized CAD model is fabricated, such as via Selective Laser Sintering (SLS) 142. The fabrication of the manufactured orthosis is explained in greater detail below.

Finally, at Stage Five (block 150), the manufactured orthosis undergoes assessment. The assessment stage may be further broken down into the two steps, including assessing the dimensional accuracy of the manufactured orthosis at step 152 and assessing the stiffness of the manufactured orthosis at step 154.

An exemplary fully-parameterized PD-AFO CAD model 200 was constructed using Inventor Professional v11 software (Autodesk, Inc., San Rafael, Calif., USA) to implement the above process. The following provides a description of the exemplary process.

Stage 1: Subject Characterization

Figure 2A:
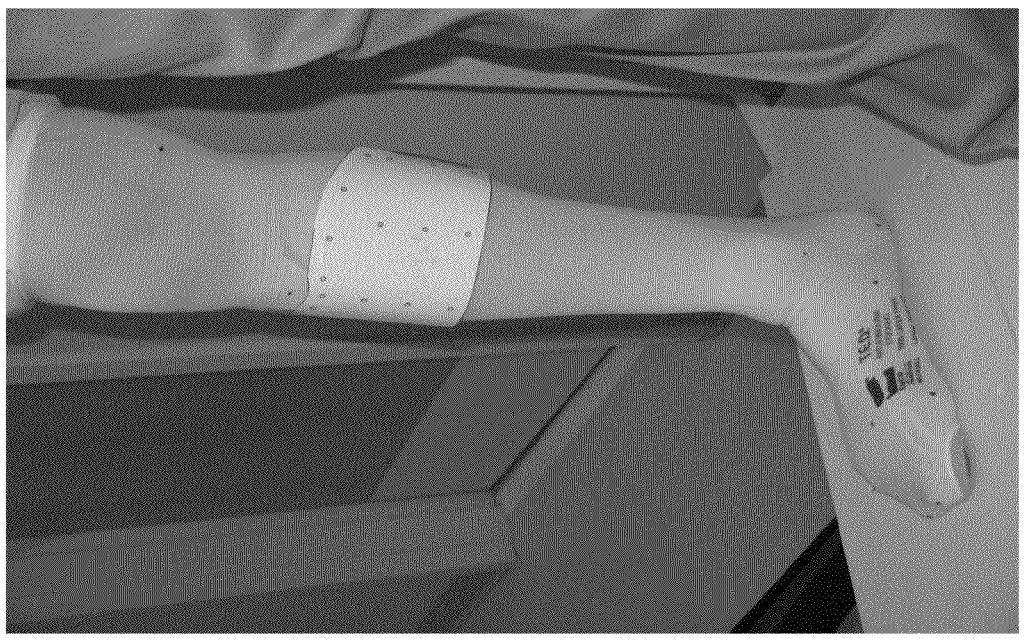
FIGS. 2A and 2B depicts side views of an exemplary subject's leg during an exemplary subject fit characterization stage, in which the locations of marked landmarks are acquired using a three-dimensional coordinate digitizer.
Figure 2B:
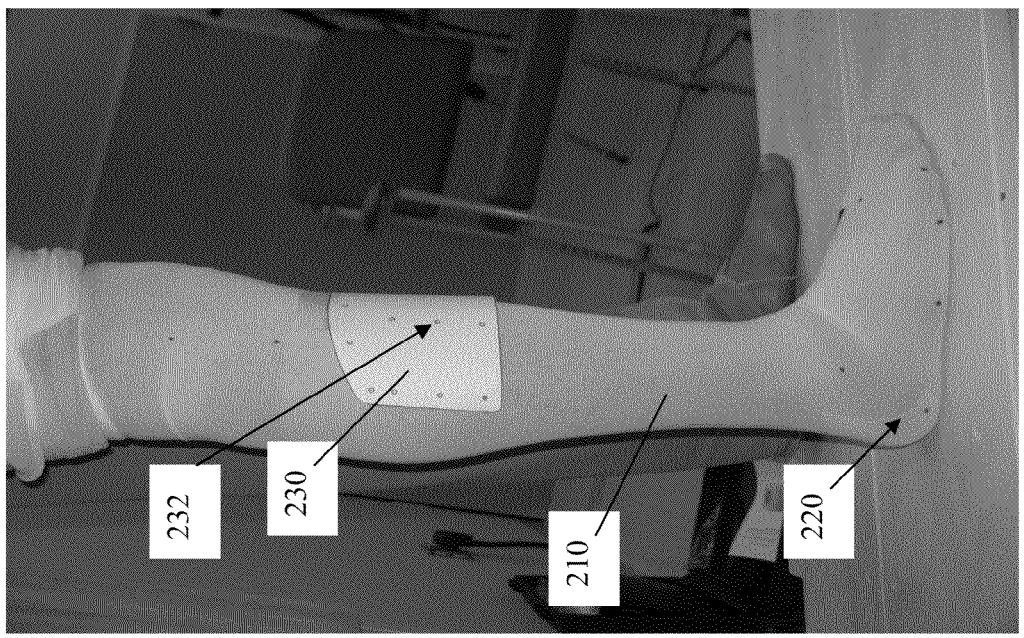

To prepare the model, the subject was positioned standing symmetrically on a pelvic stabilization stand wearing a white knee high stocking 210 as shown in FIGS. 2A and 2B. The pelvic stabilization stand helped assure the subject remained motionless during the digitization of anatomical landmarks. An exemplary suitable pelvic stabilization stand included a raised, backwardly inclined platform with attached backrest on which a subject stood motionless by resting the posterior aspect of their pelvis against the backrest. Thus, this step can be generally characterized as comprising placing a form-fitting garment on the part of the subject's body and designating landmarks for data capture and storage.

Exemplary landmarks for characterizing foot shape as well as foot and shank segments, listed in Table 1, were then identified by palpation and marked. The landmarks were used to create a plurality of foot shape characterization landmarks.

Although ten foot-shape-characterization marks 220 were used in this example, other exemplary embodiments may include more or fewer characterization marks. In general, therefore, the step of identifying landmarks comprises identifying suitable landmarks that define the anatomical characteristics of the portion of the subject to be fitted with the orthosis, and capturing the coordinates of those landmarks.

TABLE 1

Foot Shape Characterization Landmarks (n = 10)

Distal end of 1st toe
Distal end of 2nd toe
Distal end of 5th toe
Medial aspect of 1st metatarsal head
Lateral aspect of 5th metatarsal head
Medial aspect of navicular tubercle
Lateral aspect of 5th metatarsal base
Medial aspect of calcaneal surface
Center of posterior calcaneal surface (tuber calcanei)
Lateral aspect of calcaneal surface Shank Shape Characterization Landmarks (n = 24)

Refer to cuff template landmarks on FIGS. 2A and 2B

Foot and Shank Segment Landmarks (n = 8)

Ground plane landmarks (n = 3)
Superior aspect of 2d metatarsal head
Medial aspect of medial malleolus
Lateral aspect of lateral malleolus
Medial femoral epicondyle
Lateral femoral epicondyle A customized outline of foot shape was obtained from a series of splines fit to the ten foot shape characterization landmarks 220 shown in Table 1. In this exemplary embodiment, three ground plane landmarks defined the standing support surface. Thus, although the ground plane landmarks are relevant for a PD-AFO, this step generally comprises identifying and capturing landmarks relating to a reference plane. While capturing landmarks relative to a reference plane may be particularly relevant for certain types of orthosis, such as a PD-AFO, capture of reference plane landmarks is not mandatory for every type of orthosis. The remaining foot and shank segment landmarks 220 were used to locate joint centers and anatomically-relevant and biomechanically-aligned segment coordinate systems for the shank and foot segments.

A cuff template 230 was used to indicate the locations of the shank shape characterization landmarks 232. The number of characterization marks 232 may vary as needed. In the present example, 24 shank shape characterization marks 232 were used, however, more or fewer marks may be used. The cuff template was created using Autodesk Inventor Professional v11 (Autodesk, Inc., San Rafael, Calif.), but the invention is not limited to use of any particular software. While the fully parameterized PD-AFO model accepts a range of cuff parameters, in the exemplary embodiment, height of the cuff template was scaled to 25% of the subject's shank length and width to 60% of the shank circumference in order to mimic customary PD-AFO designs. Thus, although a cuff is the typical means for attaching a PD-AFO to a subject, in general, the process for creating an orthosis by this method includes capturing the 3-dimensional coordinates for landmarks corresponding to whatever means are used for attaching the orthosis to the subject.

The cuff template 230 was positioned and secured to the subjects' leg by using adhesive tape, but any attachment means known in the art may be used. Once all the landmarks were attached to the subject, the three-dimensional location of each landmark was individually acquired using a calibrated 3D Fusion FaroArm measuring arm (±0.036 mm accuracy; FARO Technologies Inc., Lake Mary, Fla.). It should be understood to one of skill in the art that the invention is not limited to any particular type of measuring arm or other type of coordinate measurement device, and that any apparatus capable of acquiring the three-dimensional coordinates of landmarks relative to a reference coordinate system may be used. The three-dimensional locations of the landmarks were then recorded using Geomagic Studio 9 (Geomagic, Inc., Research Triangle Park, N.C.). Any recording apparatus may be used, however.

Figure 3:
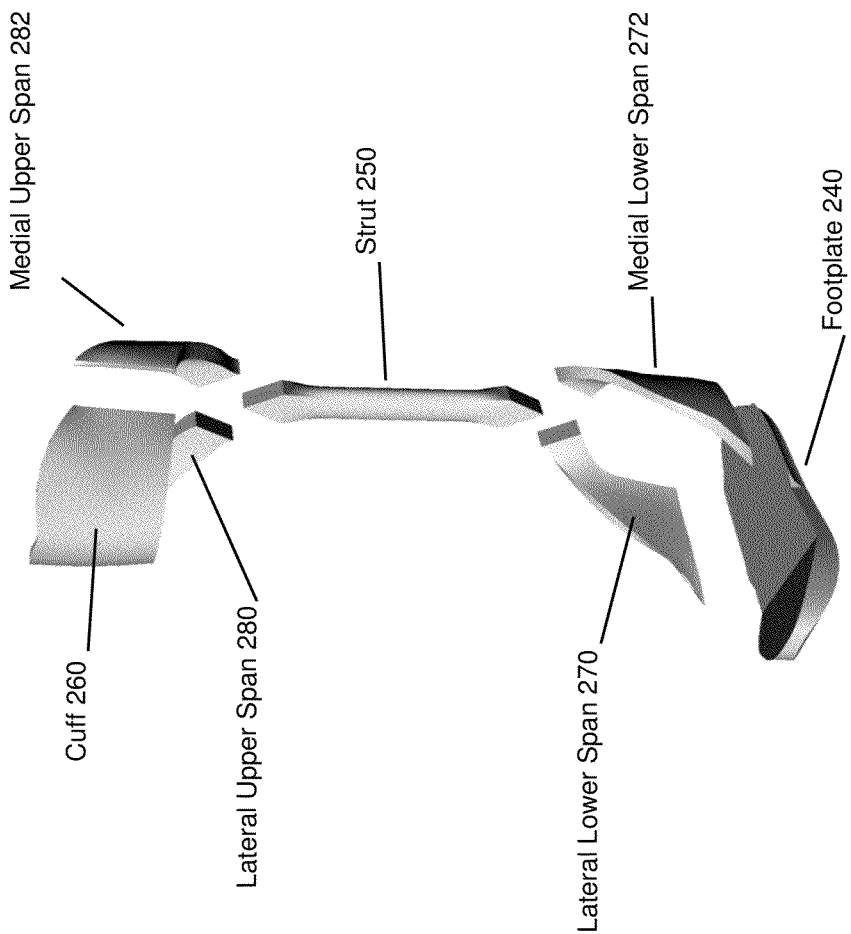
FIG. 3 depicts an exemplary right side orthosis during the CAD model stage, showing labeled components.

Once the three-dimensional landmarks were recorded, the CAD program was used to construct the model. As shown in FIG. 3, the CAD model contains three primary components, a footplate 240, strut 250 and cuff 260. Footplate 240 and strut 250 are joined by lateral lower span 270 and medial lower span 272. Strut 250 and cuff 260 are joined by lateral upper span 280 and medial upper span 282. The footplate two-dimensional profile was characterized by the planar locations of 10 foot shape characterization landmarks listed in Table 1.

Stage 2: Virtual Orthopedic Alignment

A first step in the virtual orthopedic alignment stage for a PD-AFO comprises establishing segment coordinate systems for the shank and foot. In the exemplary process, this began by computing the locations of three virtual landmarks: the ankle joint center, knee joint center and ankle joint center projection onto the ground plane. The ankle joint center and knee joint center locations were calculated as the midpoint of the line connecting the digitized medial and lateral malleoli and femoral epicondyle landmarks, respectively. The location of the ankle joint center projection was determined by translating the ankle joint center landmark to the ground plane along a displacement vector perpendicular to the ground plane. A vector connecting the ankle and knee joints defined the shank coordinate system longitudinal axis.

A shank medial/lateral axis was defined as passing through the ankle joint center and residing in the segment's frontal plane, which passed through the ankle joint center and the digitized medial and lateral femoral epicondyle landmarks. The third axis of the shank coordinate system was defined orthogonal to the longitudinal and medial/lateral axes. The foot longitudinal axis was defined parallel to the ground plane and passed through the ankle joint center and the vertical projection of the digitized second metatarsal head landmark. The foot coordinate system medial/lateral axis was parallel to the ground plane and perpendicular to the foot longitudinal axis. The vector from the ankle joint center to ankle joint center projection served as the third axis of the orthogonal foot coordinate system. The ankle joint center served as the origin of both segment coordinate systems.

The strut component was sized as a function of shank length and shaped by a series of parallel, two-dimensional profiles that offset in the posterior direction from the shank segment longitudinal axis by an operator specified distance. The profiles were then lofted together to form a three-dimensional strut component. The top and bottom strut segments were then beveled to enable attachment of the upper and lower spans.

Generally, therefore, this step can be characterized as calculating coordinates of one or more virtual landmarks corresponding to one or more anatomical joint centers or joint projection locations and converting the coordinates for all of the captured and calculated landmarks from the coordinate system from a first coordinate system corresponding to the coordinate system in which the actual landmarks were captured, to a second, anatomically relevant coordinate system.

Stage 3: CAD Model Customization

Thus, computationally registering (locating) the captured and virtual landmarks in their respective shank and foot coordinate systems facilitates the final step of the virtual orthopedic alignment process: alignment of the virtual ankle joint. The exemplary embodiment used scripts written using MATLAB® software (Math Works, Inc., Natick, Mass., USA), but the invention is not limited to use of any particular software. Custom-written scripts were used to calculate the three-dimensional orientation of the shank coordinate system relative to the foot coordinate system. The digitized and virtual shank segment and shape characterization landmarks were computationally rotated with the shank coordinate system about three orthogonal axes such that the PD-AFO cuff and footplate components conformed to a neutral orthosis orientation such that the shank coordinate systems were orthogonal to the foot coordinate system. The fully-parameterized PD-AFO CAD model was then customized using the resulting 3D landmark locations and a series of pre-selected design parameter values. Generally, this step can be characterized as clinically aligning the captured and virtual landmarks in a reference position of one of the anatomical joint centers, such as a neutral reference position.

Figures 4A, 4B, 4C, 4D:
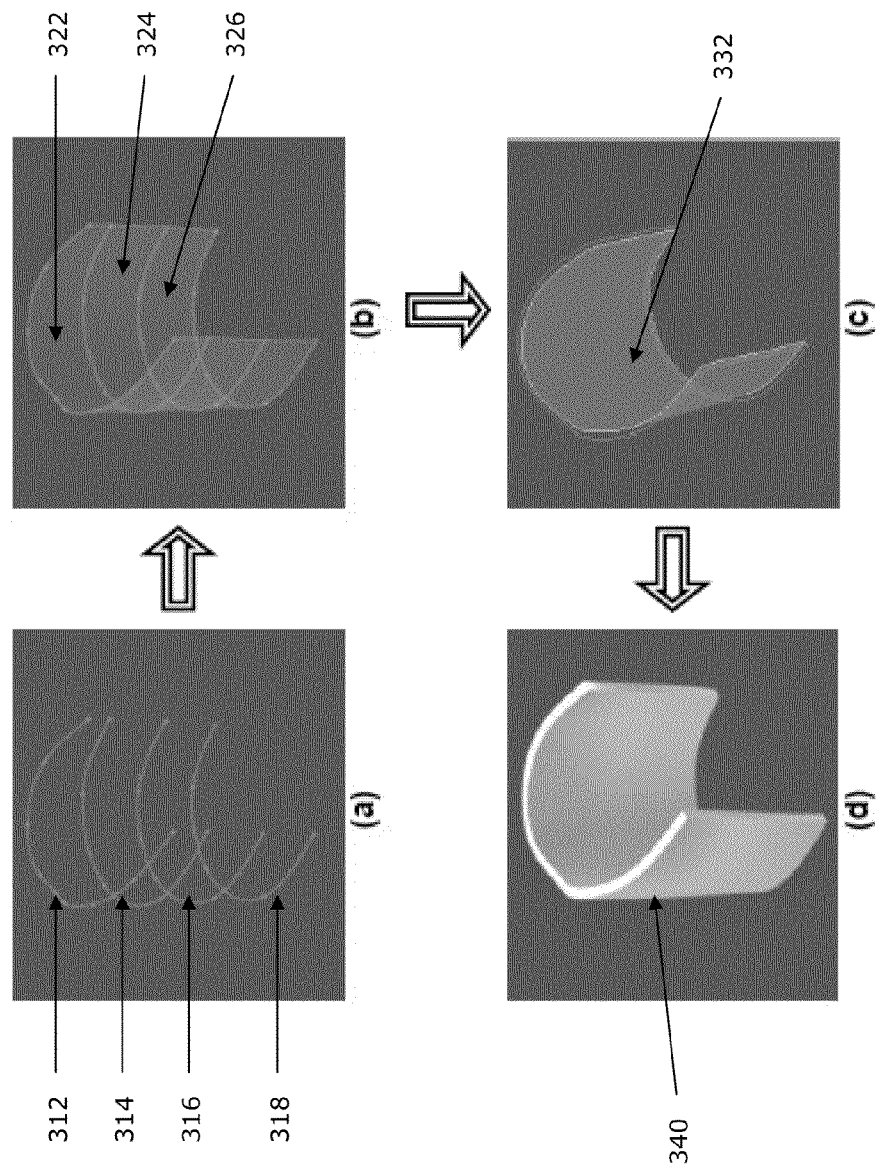
FIG. 4A depicts four exemplary three-dimensional splines used to connect the four rows of shank shape characterization landmarks residing on the cuff template.
FIG. 4B depicts an exemplary cuff surface created via the vertical lofting of the four initial splines.
FIG. 4C depicts an exemplary cuff inner surface radially offset from the shank longitudinal axis to accommodate padding thickness.
FIG. 4D depicts an exemplary outwardly-thickened cuff surface.

The cuff component was automatically sized, shaped and positioned using four rows of lofted 3D splines 312, 314, 316 and 318, each connecting a row of shank shape characterization landmarks as shown in FIG. 4A. The CAD model then lofted together the splines to create initial interior cuff surfaces 322, 324 and 326 as shown in FIG. 4B. Single parameter values were then used to radially offset the cuff surface from the shank segment longitudinal axis to accommodate a desired padding 332 thickness as illustrated in FIG. 4C. FIG. 4D shows the uniformly thickened radially expanded cuff surface 340 used to create a custom three-dimensional cuff component.

Figure 7:
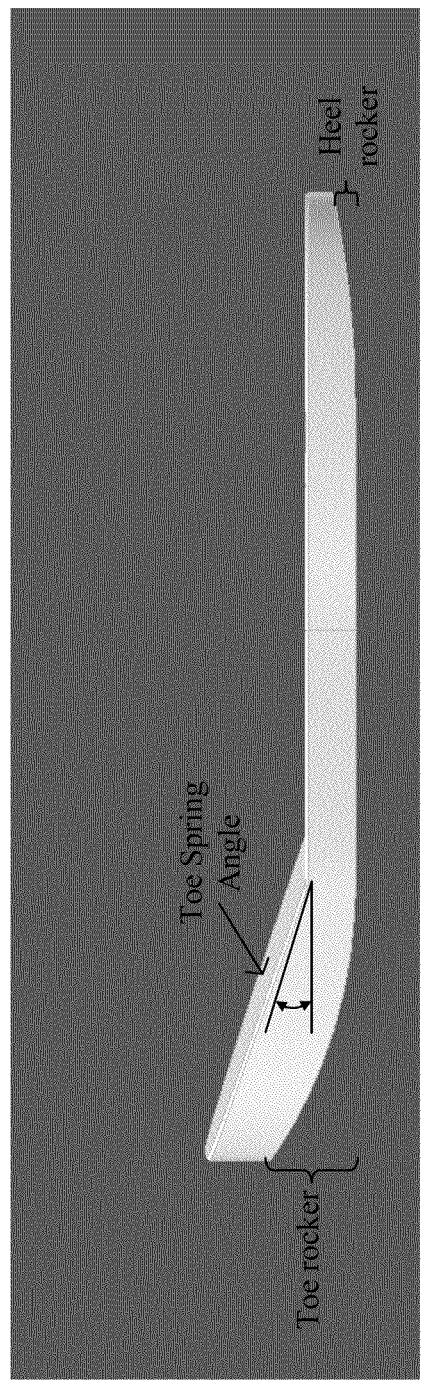
FIG. 7 depicts an exemplary orthosis footplate, illustrating the toe rocker, heel rocker, and toe spring angle.

Additional design parameters may be implemented to further control the fit of the PD-AFO CAD model as well as custom tune the bending stiffness to match a subject's needs. These design parameters may include footplate, span and strut thicknesses, illustrated in FIG. 5, footplate padding offset, cuff thickness, cuff padding offset, strut offset and several additional footplate shape parameters, such as toe rocker curvature, heel rocker curvature, and toe spring angle, illustrated in FIG. 7.

Figure 5:
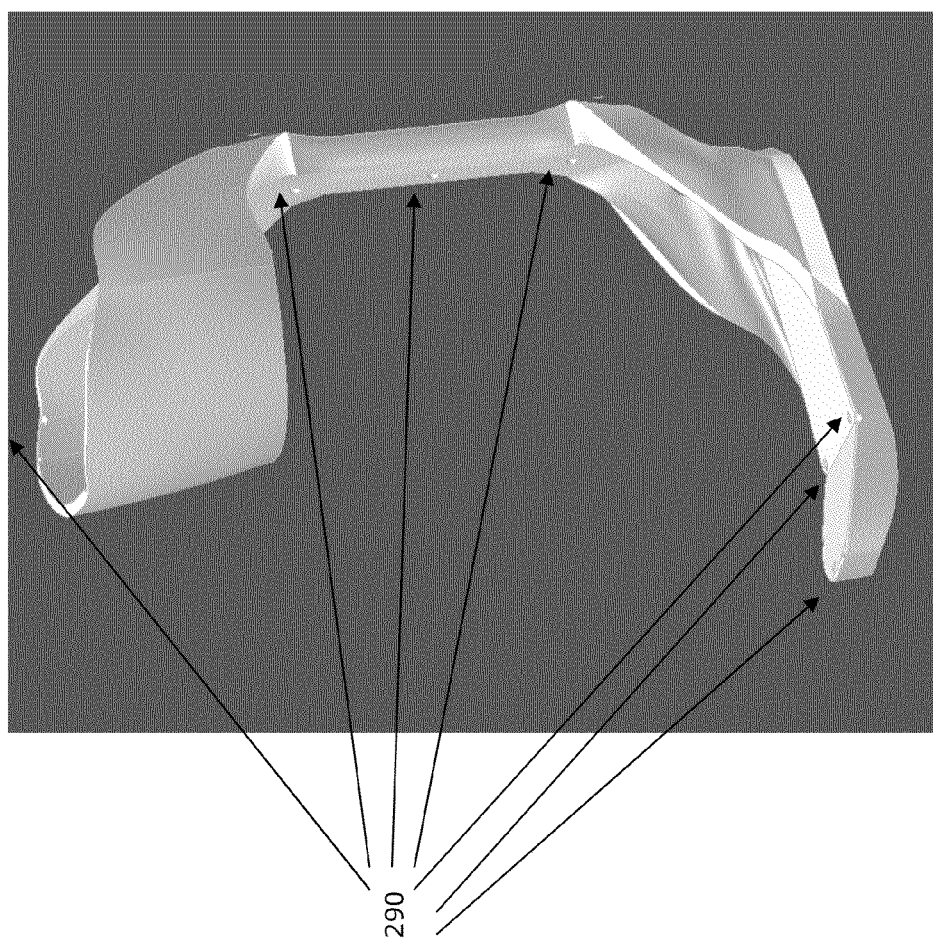
FIG. 5 depicts hemispherical dimples added during the CAD process.
Figure 6B:
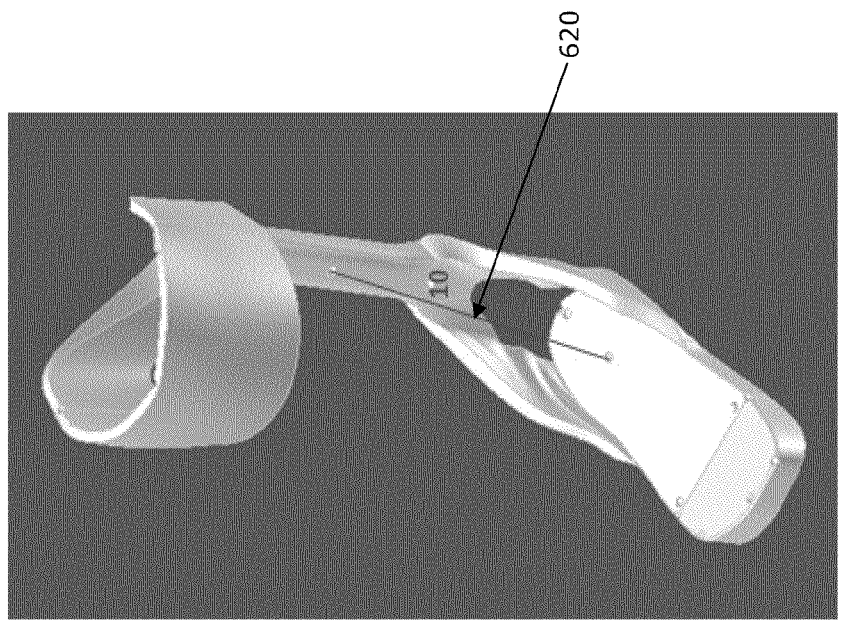
FIGS. 6A and 6B depict exemplary intra-component dimensions measured during a dimensional accuracy assessment step.
Figure 6A:
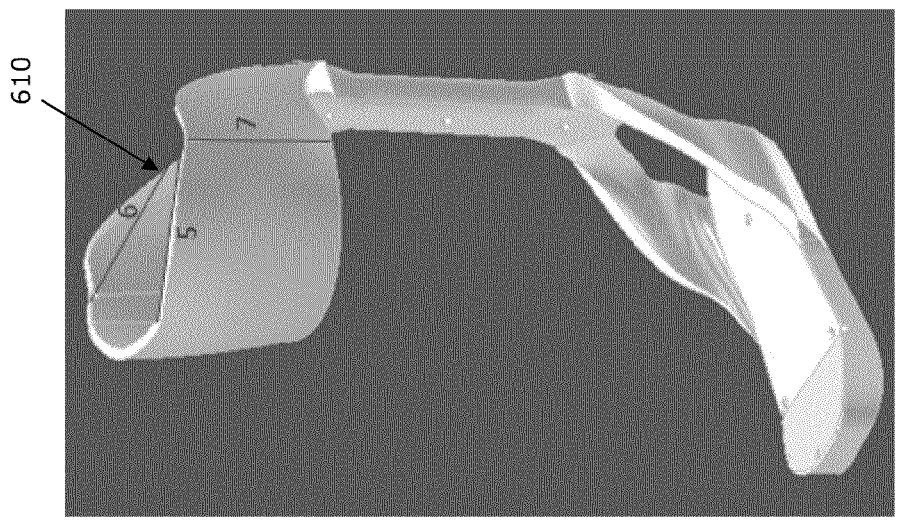

The footplate and cuff thickness parameters control the footplate profile extrusion distance and interior cuff surface thickening distance, respectively. Since all design parameter values may be set by the operator and standardized prior to loading the subject-specific landmark data, the entire PD-AFO CAD model is constructed without operator involvement. In the exemplary embodiment, hemispherical dimples 290 were added to the CAD model footplate, strut and cuff to enable subsequent dimensional accuracy assessment of each component (intra-component 610) and the overall orthosis (inter-component 620). An example of additional hemispherical dimples 290 and the intra-component 610 and inter-component 620 measurements (lines labeled 5, 6, 7 and 10) are shown in FIGS. 5, 6A and 6B.

Stage 4: Fabrication

During stage four, the exemplary orthoses was fabricated via SLS. For the purposes of testing variability introduced by the subject process, exemplary PD-AFOs were built in different combinations of orientation relative to the SLS laser beam and position relative to SLS build volume. For the purposes of this testing, half-scale PD-AFOs were built so PD-AFOs could be fabricated in various orientations and positions in a single build, as the size of the build volume restricted multiple full scale PD-AFOs from being fabricated in the same build. A full scale orthosis was also fabricated. Although the exemplary embodiment described above was fabricated via SLS, it is understood that any rapid, customizable computer-aided-manufacturing process known in the art, particularly those known for rapid prototyping and capable of creating a suitable orthosis out of suitable materials may be used. Other known exemplary processes for rapid prototyping known in the art include but are not limited to fused deposition modeling (FDM), stereolithography (SLA), laminated object manufacturing (LOM), electron beam melting (EBM), and 3D printing (3DP). While certain of the above processes may not currently be optimal or superior to SLS with respect to cost or materials of construction, advances in technology may increase the viability of one or more of these or other rapid prototyping techniques to the processes described herein.

Stage 5: PD-AFO Assessment

Finally at Stage Five 150, the three-dimensional inter-dimple distances (centroid-to-centroid) on the manufactured PD-AFOs were measured. In the exemplary embodiment, these measurements were performed using the FaroArm device fit with a 3 mm spherical tip, but any known measurement system may be used. Each dimple 290 was digitized multiple times to assess repeatability. Three footplates, one strut and three cuff dimensions (three-dimensional inter-dimple distance) were measured to assess the intra-component dimensional accuracy of each of the three components. Additionally, three inter-component dimensions, two between the footplate and cuff, and one between the footplate and strut, were measured to assess the dimensional accuracy of the overall orthosis. Discrepancies in experimental dimensions were computed relative to the corresponding CAD model dimension. The absolute maximum discrepancy, mean discrepancy and the standard deviation was determined for each dimension measurement. A discrepancy tolerance on the order of two millimeters was selected for the exemplary embodiment, but any tolerance found to be acceptable may be used. A two-way analysis of variance (ANOVA) with repeated measures was performed to assess differences in the magnitude of discrepancies between constructed orthoses and corresponding CAD dimensions.

It should be understood that once a certain CAM process for a specific type of material and fabrication orientation has been characterized (with either full-size or scale models) and compared to CAD dimensions corresponding to the captured coordinates, this information can be used to incorporate scaling parameters into subsequent processes used for making future orthoses. Accordingly, although it may still be desirable to include one or more sets of reference marks on a full size orthosis for checking dimensional accuracy of the manufactured orthosis to confirm that no unexpected variations in the fabrication process have occurred, this step can be omitted if the scaling parameters are understood and there is acceptable confidence in the integrity of the process that no such dimensional checks are deemed necessary.

Once constructed, the footplate, strut and cuff were connected by a set of lofted upper and lower spans, which are fit-controlled by the footplate, strut and cuff locations as well as the digitized landmarks. A set of assembly rules may be defined to ensure a smooth connection between components as well as clearance of the spans from the subject's bony prominences.

Upon final completion and fabrication of the orthosis, the full-scale PD-AFOs were padded by securing a thin, off-the-shelf, foam arch support on the footplate surface and adhering a layer of foam padding to the interior cuff surface. Straps were attached to the footplate to help secure the subject's foot in the PD-AFO. Fit customization was visually assessed by a physical therapist. After the subject walked in the PD-AFO for a given period of time (approximately one hour), subjects demonstrated a fully accommodated, smooth and rhythmic gait pattern and reported no discomfort. Upon visual inspection by a clinician, the skin under the cuff and about the foot showed no signs of uneven pressure distribution, redness or abrasions for either subject.

EXAMPLE

In one example 3D digitized landmark data were obtained from the right lower extremity of two subjects: one healthy male subject (age 48 years; height 1.77 m; mass 71.8 kg) and one healthy female subject (age 21 years; height 1.65 m; mass 59.9 kg). Each of the subjects underwent the process described above.

All four PD-AFOs were fabricated in a single build in an SLS Vanguard HS machine with stable temperature control using DuraForm® EX Natural Plastic (3DSystems, Rock Hill, S.C., USA). Manufacturer-indicated build settings were used, and scale factors were determined using industry standard techniques to account for part shrinkage. In a separate build, two full-scale PD-AFOs were fabricated and stiffness tuned to 50% of the subjects' natural pseudo-ankle-stiffness to enable subjective assessment of the fit customization by the subjects during PD-AFO use.

Three-dimensional distances for the intra- and inter-component dimensions obtained from the PD-AFO CAD model ranged from 26.01 to 176.8 mm. Prior to building, the SLS build volume was scaled using industry standards by 1.0464%, 1.0469% and 1.0350% in the SLS x, y, and z-build directions, respectively. Four half-scale PD-AFOs were fabricated in less than 24 hours and extracted from the build volume following the customary cool down period. Visual inspection of the fabricated PD-AFOs revealed no obvious manufacturing flaws.

The dimensional accuracy data were all within acceptable intra- and inter-component dimensional accuracy tolerances as all dimension discrepancies were within the 2 mm limit. No dimension discrepancy was greater than 1.5 mm, with the majority of the discrepancies below 0.5 mm. Across all PD-AFOs and all measured dimensions, the maximum absolute dimension discrepancies were 1.02 mm, 0.42 mm, 1.44 mm and 0.88 mm for the footplate, strut, cuff and overall orthosis, respectively. Overall mean discrepancies for the footplate, strut, and cuff components were 0.31±0.28, 0.34±0.08, 0.52±0.39 mm respectively and 0.29±0.23 mm for the overall orthosis. There was good repeatability in experimental measures across the three digitizing trials, as indicated by the low standard deviations (maximum SD=0.39 mm). No significant effects of the SLS build orientation and position on dimensional accuracy were found, yet there was a significant effect of the dimension location on dimensional accuracy ($F(3,9)=41.41$, $p<0.0001$). A significant interaction effect between the location of the dimension and the SLS build orientation and position was also found ($F(3,9)=4.94$, $p<0.0001$).

The dimensional accuracy of PD-AFOs fabricated via the fit customization and manufacturing framework is described below. Using the process herein described, the dimensional accuracy of the fabricated PD-AFOs was generally greater than that of other SLS-fabricated parts from previous studies, which reported mean absolute dimensional discrepancies between 0.89 mm and 1.0 mm. Previous studies manufactured craniofacial models as opposed to PD-AFOs, and the difference in part geometry may explain the variation in results. Additionally, the craniofacial models were made based on reconstructed imaging data, and fabricated model dimensions were compared to the imaging scans. Therefore, the accuracy of the fabricated parts was based on the precision of reconstructing and obtaining dimension measurements from the imaging data as well as the accuracy of the SLS manufacturing process. In contrast, to assess dimensional accuracy, fabricated PD-AFO dimensions were compared to the CAD model dimensions, eliminating possible sources of error from the subject fit characterization and virtual orthopedic alignment stages. The fit customization assessment was used to further evaluate the accuracy of the fabricated PD-AFOs, as this step compared the fabricated PD-AFO to the subjects, from whom the original digitized landmark data were collected.

Examination of the interaction effect between the location of the dimension and the SLS build orientation and position showed that the PD-AFOs built with the strut oriented horizontal to the SLS laser beam had lower dimensional discrepancies in strut height and cuff height (dimensions 4 and 7) than PD-AFOs built with the strut oriented vertical to the laser beam. Dimension 5, the cuff width was more accurate in PD-AFOs built with the strut vertical to the SLS laser beam as opposed to in PD-AFOs built with the strut horizontal to the laser beam. This data may suggest that although no overall significant effect of PD-AFO orientation and position was found, dimensional accuracy may improve when the longitudinal axis of a part is oriented horizontally, or perpendicular to the SLS laser beam. There was no dimensional accuracy interaction effect between dimension location and SLS build position.

The fully parameterized nature of the PD-AFO CAD model lends itself extremely well to further customization. By a series of parameterized cardan rotations, the fully-parameterized CAD model may readily be aligned into a full range of clinically-indicated positions with precisely prescribed degrees of dorsiflexion/plantarflexion, inversion/eversion, and abduction/adduction of the shank relative to the foot. For instance, in the case of a plantarflexor contracture, the limb can be digitized in the contracted position but the PD-AFO CAD model can be customized and subsequently fabricated with a prescribed amount of dorsiflexion in order to bring the patient's ankle into a more functional position. Furthermore, the footplate size and shape can be modified so the PD-AFO can be customized to a specific shoe or implemented without a shoe.

The fit customization and manufacturing framework described may be one component of an entire automated customization and manufacturing framework, which incorporates customization of PD-AFO functional characteristics, including select footplate characteristics and PD-AFO bending stiffness. While tuning the PD-AFOs to 50% of the subjects' natural pseudo ankle stiffness was based on observations of commercial carbon fiber AFOs that patients found to be comfortable, the stiffnesses of the PD-AFOs used in this study were higher than many orthoses currently on the market. Functional characteristics may be optimized for desired influence on gait kinetics and kinematics. With the help of clinical expertise and further biomechanical investigation, the CAD model parameter settings controlling the functional characteristics may be prescribed to optimally customize the PD-AFO to meet the unique needs of every patient. Furthermore, the PD-AFO customization and manufacturing framework prescribes utilization of CAD-compatible finite element analysis and optimization tools to analytically tune functional characteristics such as strut and footplate bending stiffnesses, in order to automatically obtain results similar to those manually achieved. The fully-parameterized nature of the PD-AFO CAD model supports the optimization of parameters to achieve a desired PD-AFO functional characteristic. Thus, customized stiffness characteristics may be rapidly obtained by automatically converging on PD-AFO parameter settings related to bending stiffness. After fabrication and dimensional accuracy assessment, the stiffness characteristics may also be assessed through experimental testing. Lastly, as a supplement to the design process, the PD-AFO function customization may be evaluated while the subject walks with the PD-AFO through motion analysis and other experimental techniques.

For example, in one embodiment, finite element analysis (FEA) may be used to evaluate and iteratively optimize the rotational stiffness of an exemplary PD-AFO. In this way, the orthosis the orthosis bending stiffness may be tuned to match a subject's pseudo ankle joint stiffness. It should be understood that "matching" the joint stiffness of the subject may within some acceptable level of tolerance and does not require an exact replication of the subject's joint stiffness. This tuning may be based upon subject information, such as height and weight, as well as standard gait information or individual gait information. This information provides inputs that can be used to determine the optimal stiffness for the orthosis. Thus, one level of customization may include using standard informational databases to provide force inputs to the FEA model, which can be further refined to reflect information regarding specific individuals. The ability to provide such tuning of stiffness and other functional characteristics of the orthosis to customize the fit to the individual in the CAD model prior to manufacture, followed by CAM manufacturing techniques to quickly fabricate the customized orthosis, is a distinct advantage relative to prior art processes and systems for fabricating orthoses.

One suitable FEA model comprised modeling the subject orthosis, including the PD-AFO and cuff insert, with a testing rod in the place of a subject's leg in the orthosis. A prescribed load normal to the testing rod's longitudinal axis in the sagittal plane was then applied to the distal end of the testing rod. Several variables were then considered for tuning the device, such as rotational stiffness, cuff "pistoning" and the cuff-shank interface (CSI). For rotational stiffness, the ratio of moment about the testing rod hinge to the angular deformation of the outer center cuff surface was considered. The deformation was calculated using the FEA-predicted cuff translational displacement in the sagittal plane. Longitudinal motion of the cuff insert relative to the testing rod was used for defining cuff "pistoning." The amount of gap between the testing rod and the cuff insert surfaces and pressure distribution over the inner cuff was used for defining the cuff-shank interface. Stiffness was then optimized to minimize cuff pistoning and CSI by iteratively exploring parameters such as strut cross-sectional area and span thicknesses. In should be understood, however, that these virtual prototyping techniques are not limited to FEA modeling or any other specific modeling technique, nor is the invention limited to tuning any particular functional characteristics or using any particular variables for such tuning. In general, virtual prototyping permits tuning of any number of parameters in the CAD environment, and, for example, in a PD-AFO embodiment, may also be used for optimizing the heel and toe rocker design and strut offset angle. Although the ankle joint is the relevant joint for a PD-AFO embodiment, virtual prototyping may be used for matching the stiffness of an orthosis for any part of the body to the joint stiffness of the affected joint supported by the orthosis.

It should be understood by one skilled in the art that any and/or all of the various process steps of this invention may be carried out by a computer processor or network of computer processors programmed with instructions for performing the steps. Programming techniques are well known in the art and not limited to any particular types of software or processors described herein.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. A process for creating a specification for a customized device for a subject, the process comprising the steps of:
   (a) developing a fully parameterized standardized model for characterizing the device, the model configured to accept a plurality of customization inputs, the customization inputs comprising a plurality of design parameter values and 3-dimensional coordinates corresponding to a plurality of landmarks;
   (b) digitally capturing 3-dimensional coordinates corresponding to a plurality of captured landmarks relative to a subject, the captured landmarks comprising points characteristic of elements selected from the group consisting of: anatomical characteristics of the subject, means for attachment of the device to the subject, and a reference plane;
   (c) calculating 3-dimensional coordinates for one or more virtual landmarks based upon the captured landmarks;
   (d) constructing a customized model of the customized device by populating the fully parameterized standardized model with the design parameter values and the virtual and captured landmarks;
   (e) angularly aligning the virtual and captured landmarks in a reference position using the customized model; and
   (f) generating an output from the customized model corresponding to the specification for the customized device.

2. The process of claim 1 further comprising the step of:
   (g) transmitting the specification to a computer aided manufacturing process for automatically fabricating the customized device.

3. The process of claim 1, wherein the customized device is an ankle-foot orthosis.

4. The process of claim 1, comprising digitally capturing and calculating the virtual coordinates in steps (b) and (c) within a first coordinate system and converting the coordinates from the first coordinate system to at least one second, anatomically relevant coordinate system prior to step (ee).

5. The process of claim 2, wherein the computer aided manufacturing process comprises a selective laser sintering process.

6. The process of claim 3, wherein the captured landmarks correspond to landmarks defining size and shape characteristics of the subject's shank and foot, the means for attachment of the orthosis comprises a cuff, and the virtual landmarks correspond to an ankle joint center, a knee joint center, and an ankle joint center projection location.

7. The process of claim 6, wherein step (e) comprises angularly aligning the captured and virtual landmarks with the ankle joint center in a reference position.

8. The process of claim 7, wherein the reference position is a neutral reference position.

9. The process of claim 6, wherein the ankle-foot orthosis comprises a footplate for disposition under the subject's foot, a strut connected to the footplate, and a cuff connected to the strut for affixation to the subject's shank.

10. The process of claim 9, wherein the model further includes inputs for customizing one or more parameters selected from the group consisting of: footplate thickness, footplate padding offset, cuff thickness, cuff padding offset, strut offset, toe rocker curvature, heel rocker curvatures, and toe spring angle.

11. The process of claim 1, further comprising using the customized computer model to tune one or more functional characteristics of the device to customize the device for the subject.

12. The process of claim 11, further comprising tuning stiffness of the device to reflect stiffness in an affected joint of the subject.

13. The process of claim 2, wherein the ankle-foot orthosis comprises a footplate for disposition under the subject's foot, a strut connected to the footplate, and a cuff connected to the strut for affixation to the subject's shank, and wherein step (a) comprises developing the fully parameterized standardized model for characterizing the footplate, the strut, and the cuff of the orthosis, the process further comprising the step of:
(g) transmitting the specification to a computer aided manufacturing process for automatically fabricating the customized device,
(h) fabricating the customized ankle-foot orthosis directly from the customized model using a computer aided manufacturing process.

14. The process of claim 13, wherein the computer aided manufacturing process comprises a selective laser sintering process.

15. The process of claim 13, wherein the model further includes inputs for customizing one or more parameters selected from the group consisting of: footplate thickness, footplate padding offset, cuff thickness, cuff padding offset, strut offset, toe rocker curvature, heel rocker curvatures, and toe spring angle.

16. The process of claim 13, wherein the ankle-foot orthosis further comprises a medial upper span and lateral upper span connecting the cuff to the strut and a medial lower span and lateral lower span connecting the strut to the footplate.

17. The process of claim 13, wherein the plurality of anatomical landmarks comprise landmarks corresponding to anatomical features selected from the group consisting of: distal ends of toes; medial, superior, and lateral aspects of metatarsal heads and bases, medial aspect of navicular tubercle, medial and lateral aspects of medial and lateral malleolus, medial and lateral aspects of calcaneal surface, center of posterior calcaneal surface, superior-most point on fibula, anterior aspect of tibial tubercle, and medial and lateral femoral epicondyle.

18. The process of claim 13, further comprising tuning the orthosis bending stiffness in the customized digital model of the ankle-foot orthosis to match a subject's pseudo ankle joint stiffness.

19. A system for creating a specification for a customized device for a subject, the system comprising:
a coordinate measurement machine for digitally capturing 3-dimensional locations for a plurality of captured landmarks corresponding to anatomical characteristics of the subject, means for attaching the device to the subject, and a reference plane, the coordinate measurement machine configured to provide an output corresponding to the digitally captured coordinates of the landmarks;
at least one processor or network of connected processors configured to receive the output from the coordinate measurement machine, the at least one processor or network of connected processors comprising programmed with a plurality of instructions comprising:
at least one set of instructions defining a fully parameterized standardized model for characterizing the device, the model configured to accept a plurality of customization inputs, the customization inputs comprising a plurality of design parameter values and 3-dimensional coordinates corresponding to a plurality of landmarks;
at least one set of instructions for calculating locations of one or more virtual landmarks based upon the captured landmarks;
at least one set of instructions for constructing a customized model of the customized device by populating the fully parameterized standardized model with the design parameter values and the virtual and captured landmarks;
at least one set of instructions for angularly aligning the virtual and captured landmarks in a reference position using the customized model; and
at least one set of instructions for generating an output from the customized model corresponding to the specification for the customized device.

20. The system of claim 19, further comprising a computer aided manufacturing system configured to accept the output from the customized model, the output corresponding to the specification for the customized device, the computer aided manufacturing system programmed with a set of instructions for automatically fabricating the customized device from the specification.

21. The system of claim 19, wherein the customized device is an ankle-foot orthosis.

22. The system of claim 20, wherein the computer aided manufacturing system comprises a system for selective laser sintering.

23. The system of claim 19, wherein the coordinate measurement machine comprises a measuring arm.

24. The system of claim 21, wherein the processor or network of connected processors further comprises instructions for virtually modeling forces applied to the customized digital model of the orthosis and for customizing one or more functional characteristics of the orthosis to the subject.

25. The system of claim 21, wherein the instructions for virtually modeling forces and customizing one or more functional characteristics comprises instructions for optimizing stiffness of the orthosis to match stiffness in an affected joint of the subject.

26. The process of claim 4, wherein the at least one second, anatomically relevant coordinate system comprises a shank coordinate system and an orthogonal foot coordinate system, both of which have an origin at a joint center corresponding to an ankle joint center.

27. The process of claim 1, wherein the specification for the customized device comprises a specified padding thickness.

28. The process of claim 27, wherein the padding comprises padding adapted to be disposed between a portion of a body of the subject and another portion of the device.

29. The process of claim 2, wherein the computer aided manufacturing process is selected from the group consisting of: fused deposition modeling (FDM), stereolithography (SLA), laminated object manufacturing (LOM), electron beam melting (EBM), and 3D printing.

30. The system of claim 19, wherein the specification for the customized device comprises a specified padding thickness.

31. The system of claim 30, wherein the padding comprises padding adapted to be disposed between a portion of a body of the subject and another portion of the device.

32. The system of claim 20, wherein the computer aided manufacturing system is adapted to automatically fabricate the customized device using a process selected from the group consisting of: fused deposition modeling (FDM), stereolithography (SLA), laminated object manufacturing (LOM), electron beam melting (EBM), and 3D printing.

33. The process of claim 1, wherein step (e) of angularly aligning the captured and virtual landmarks in a reference position comprises computationally rotating the landmarks into the reference position.

\* \* \* \* \*

UNITED STATES PATENT AND TRADEMARK OFFICE
CERTIFICATE OF CORRECTION

| | | |
|---|---|---|
| PATENT NO. | : 8,538,570 B2 | Page 1 of 1 |
| APPLICATION NO. | : 12/879805 | |
| DATED | : September 17, 2013 | |
| INVENTOR(S) | : Steven J. Sanhope and Elisa Schrank | |

It is certified that error appears in the above-identified patent and that said Letters Patent is hereby corrected as shown below:

In the Claims

At Column 14, line 53, in claim 4, "to step (ee)."
should read -- to step (e). --

At Column 16, line 43, "customized digital model"
should read -- customized model --

Signed and Sealed this
Twenty-seventh Day of May, 2014

Michelle K. Lee
*Deputy Director of the United States Patent and Trademark Office*